(12) United States Patent
Kobayashi et al.

(10) Patent No.: US 11,557,494 B2
(45) Date of Patent: Jan. 17, 2023

(54) SUBSTRATE SUPPORT AND INSPECTION APPARATUS

(71) Applicant: TOKYO ELECTRON LIMITED, Tokyo (JP)

(72) Inventors: Masahito Kobayashi, Yamanashi (JP); Hiroyuki Nakayama, Yamanashi (JP); Dai Kobayashi, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/356,939

(22) Filed: Jun. 24, 2021

(65) Prior Publication Data
US 2021/0407829 A1 Dec. 30, 2021

(30) Foreign Application Priority Data
Jun. 26, 2020 (JP) .............................. JP2020-110831

(51) Int. Cl.
| | | |
|---|---|---|
| *H01L 21/67* | (2006.01) | |
| *G01R 31/28* | (2006.01) | |
| *G01R 31/26* | (2020.01) | |
| *H01L 21/683* | (2006.01) | |

(52) U.S. Cl.
CPC .... *H01L 21/67115* (2013.01); *G01R 31/2642* (2013.01); *G01R 31/2874* (2013.01); *H01L 21/683* (2013.01)

(58) Field of Classification Search
None
See application file for complete search history.

(56) References Cited

U.S. PATENT DOCUMENTS

| | | | |
|---|---|---|---|
| 2009/0050621 A1* | 2/2009 | Awazu | ................... H05B 3/148 |
| | | | 219/444.1 |
| 2018/0321602 A1 | 11/2018 | Lafarre et al. | |

FOREIGN PATENT DOCUMENTS

| | | | | |
|---|---|---|---|---|
| EP | 2678730 B1 | * | 9/2016 | ............. B32B 17/06 |
| EP | 3550313 A1 | * | 10/2019 | ......... G01R 1/06711 |
| JP | 2018-151369 A | | 9/2018 | |

\* cited by examiner

*Primary Examiner* — Patrick Assouad
*Assistant Examiner* — Haidong Zhang
(74) *Attorney, Agent, or Firm* — Fenwick & West LLP (57) ABSTRACT

A substrate support includes a supporting unit and a light irradiation mechanism. The supporting unit includes a plate member on which an inspection target is placed and a transparent member. The light irradiation mechanism is configured to irradiate light to increase a temperature of the inspection target. Each of the plate member and the transparent member is made of a low thermal expansion material having a linear expansion coefficient of $1.0 \times 10^{-6}$/K or less.

14 Claims, 5 Drawing Sheets

SUBSTRATE SUPPORT AND INSPECTION APPARATUS

CROSS-REFERENCE TO RELATED APPLICATIONS

This application claims priority to Japanese Patent Application No. 2020-110831, filed on Jun. 26, 2020, the entire contents of which are incorporated herein by reference.

TECHNICAL FIELD

The present disclosure relates to a substrate support and an inspection apparatus.

BACKGROUND

There is known an inspection apparatus in which a wafer or a carrier having electronic devices thereon is placed on a substrate support and electrical characteristics of the electronic devices are inspected by supplying a current from a tester to the electronic devices through probes or the like. Temperatures of the electronic devices are controlled by a cooling mechanism or a heating mechanism in the substrate support.

Japanese Patent Application Publication No. 2018-151369 discloses a substrate support that includes a cooling mechanism having an inspection target thereonto, and a light irradiation mechanism disposed to be opposed to the inspection target via the cooling mechanism. The cooling mechanism is a light transmitting member and allows a coolant (refrigerant) capable of transmitting light to flow therethrough. The light irradiation mechanism has a plurality of light-emitting diodes (LEDs) to emit light toward the inspection target.

When the inspection target is heated by the light irradiation mechanism, an upper surface side of the cooling mechanism is heated, so that the substrate support may be warped (bent) due to a temperature difference between the upper surface and a bottom surface of the cooling mechanism. Further, an area where the temperature is increased is limited by the light irradiation mechanism. Therefore, a high-temperature region where the temperature is increased by the light irradiated from the light irradiation mechanism and a low-temperature region where the light is not irradiated from the light irradiation mechanism coexist, which may lead to the warpage of the substrate support due to the temperature difference between the high-temperature region and the low-temperature region of the cooling mechanism.

SUMMARY

The present disclosure provides an inspection apparatus and a substrate support capable of suppressing the warpage thereof.

In accordance with an aspect of the present disclosure, there is provided a substrate support including: a supporting unit including a plate member on which an inspection target is placed and a transparent member; and a light irradiation mechanism configured to irradiate light to increase a temperature of the inspection target. Each of the plate member and the transparent member is made of a low thermal expansion material having a linear expansion coefficient of $1.0 \times 10^{-6}$/K or less.

BRIEF DESCRIPTION OF THE DRAWINGS

The objects and features of the present disclosure will become apparent from the following description of embodiments, given in conjunction with the accompanying drawings, in which.

DETAILED DESCRIPTION

Hereinafter, embodiments will be described in detail with reference to the accompanying drawings. Like reference numerals will be given to like or corresponding parts throughout the drawings, and redundant description thereof will be omitted.

Inspection Apparatus

Figure 1:
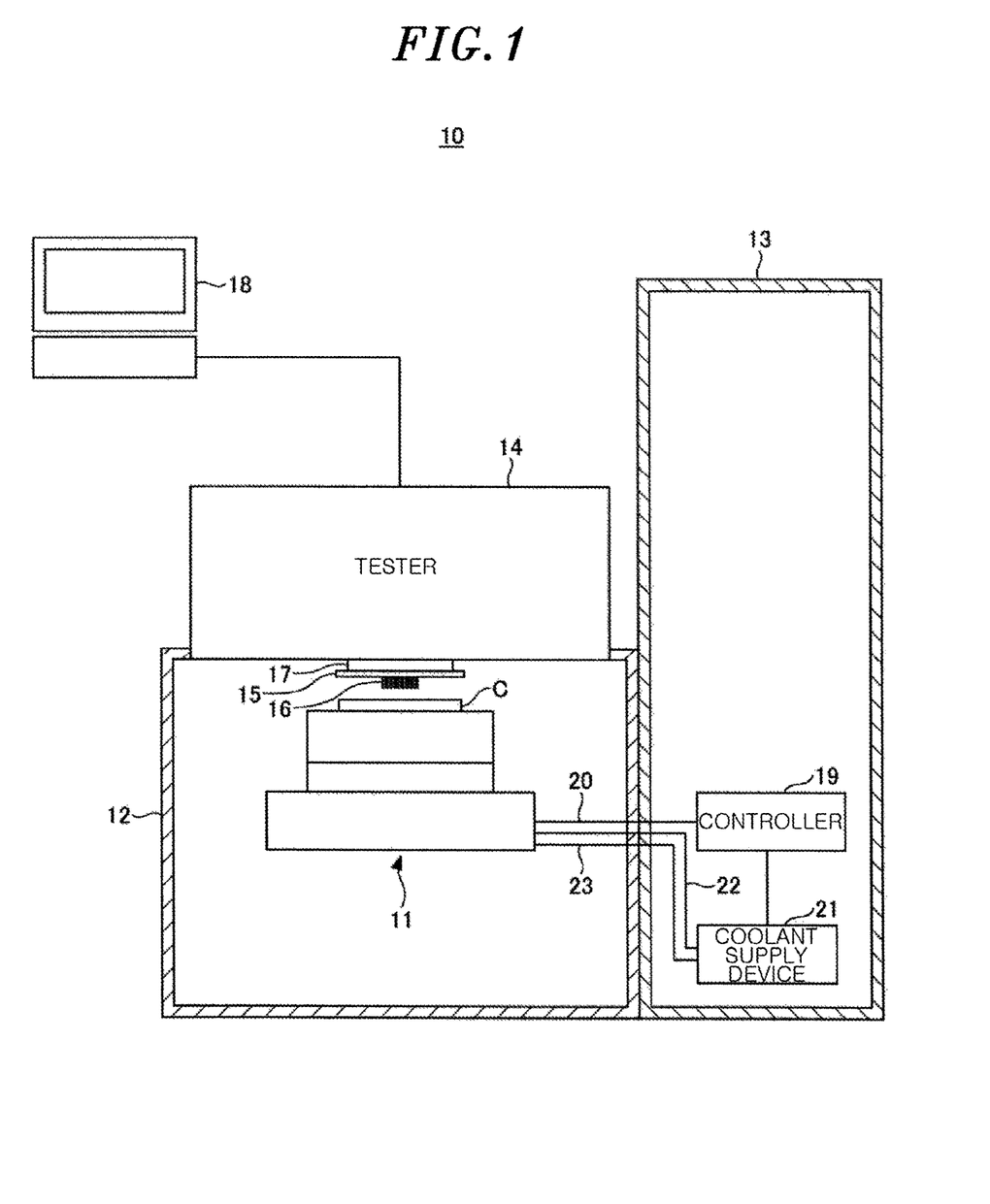
FIG. 1 is a cross-sectional view schematically showing a configuration of an inspection apparatus according to an embodiment.

An inspection apparatus 10 including a stage (substrate support) 11 according to an embodiment will be described with reference to FIG. 1. FIG. 1 is a cross-sectional view schematically showing a configuration of the inspection apparatus 10 according to the embodiment.

The inspection apparatus 10 is configured to respectively inspect electrical characteristics of a plurality of electronic devices disposed on a carrier (inspection target) C. The inspection apparatus 10 includes an accommodating chamber 12 accommodating a stage 11 on which the carrier C is placed, a loader 13 disposed adjacent to the accommodating chamber 12, and a tester 14 disposed to cover the accommodating chamber 12.

The accommodating chamber 12 has a hollow housing shape. In the accommodating chamber 12, the stage 11 on which the carrier C is placed and a probe card 15 disposed to face the stage 11 are accommodated. The probe card 15 has a plurality of needle-shaped probes (contact terminals) 16 arranged to correspond to solder bumps or electrode pads 26 (to be described later in FIG. 2) installed correspondingly to electrodes of each electronic device 25 (to be described later in FIG. 2) of the carrier C.

The stage 11 has a fixing mechanism (not shown) for fixing the carrier C to the stage 11. Accordingly, displacement of the position of the carrier C with respect to the stage 11 is prevented. Further, a moving mechanism (not shown) for moving the stage 11 in a horizontal direction and a vertical direction is disposed in the accommodating chamber 12. Accordingly, the solder bumps or the electrode pads installed correspondingly to electrodes of each electronic device are brought into contact with the probes 16 of the probe card 15 by adjusting a relative position between the probe card 15 and the carrier C.

The loader 13 is configured to extract a carrier C having the electronic devices thereon from a FOUP (not shown) that is a transfer container and places the carrier C on the stage 11 in the accommodating chamber 12. Further, the loader 13 is configured to remove an inspected carrier C from the stage and accommodate the inspected carrier C in the FOUP.

The probe card 15 is connected to the tester 14 through an interface 17. When the probes 16 are brought into contact with the solder bumps or the electrode pads installed correspondingly to the electrodes of each electronic device of the carrier C, the probes 16 supply electric power from the tester 14 to the electronic device through the interface 17 or transmits signals from the electronic device to the tester 14 through the interface 17.

The tester 14 includes a test board (not shown) that emulates a part of a circuit configuration of a motherboard on which the electronic devices are installed. The test board is connected to a tester computer 18 that is configured to determine whether the electronic devices are defective or non-defective based on the signals from the electronic devices. In the tester 14, it is possible to emulate the circuit configurations of various types of motherboards by replacing the test board.

A controller 19 controls an operation of the stage 11. The controller 19 controls the moving mechanism (not shown) of the stage 11 to move the stage 11 in the horizontal direction and the vertical direction. Further, the controller 19 is connected to the stage 11 through a wiring 20. The controller 19 controls an operation of a light irradiation mechanism 40 to be described later through the wiring 20. The controller 19 is connected to a resistance temperature detector film 34 to be described later through the wiring 20 to detect the temperature.

A coolant supply device 21 is connected to a coolant channel 35 of the stage 11 through a supply pipe 22 and a return pipe 23, and the coolant can be circulated between the coolant supply device 21 and the coolant channel 35 of the stage 11. The controller 19 controls the coolant supply device 21 to control a temperature, a flow rate, or the like of the coolant that is supplied from the coolant supply device 21 to the coolant channel 35.

Although it is illustrated in FIG. 1 that the controller 19 and the coolant supply device 21 are disposed in the loader 13, the present disclosure is not limited thereto and the controller 19 and the coolant supply device 21 may be disposed at other portions.

In the inspection apparatus 10, when the electrical characteristics of the electronic devices are inspected, the tester computer 18 transmits data to the test board connected thereto through the electronic devices and the probes 16. Then, the tester computer 18 determines whether or not the transmitted data has been correctly processed by the test board based on the electrical signals from the test board.

Substrate Support

Figure 2:
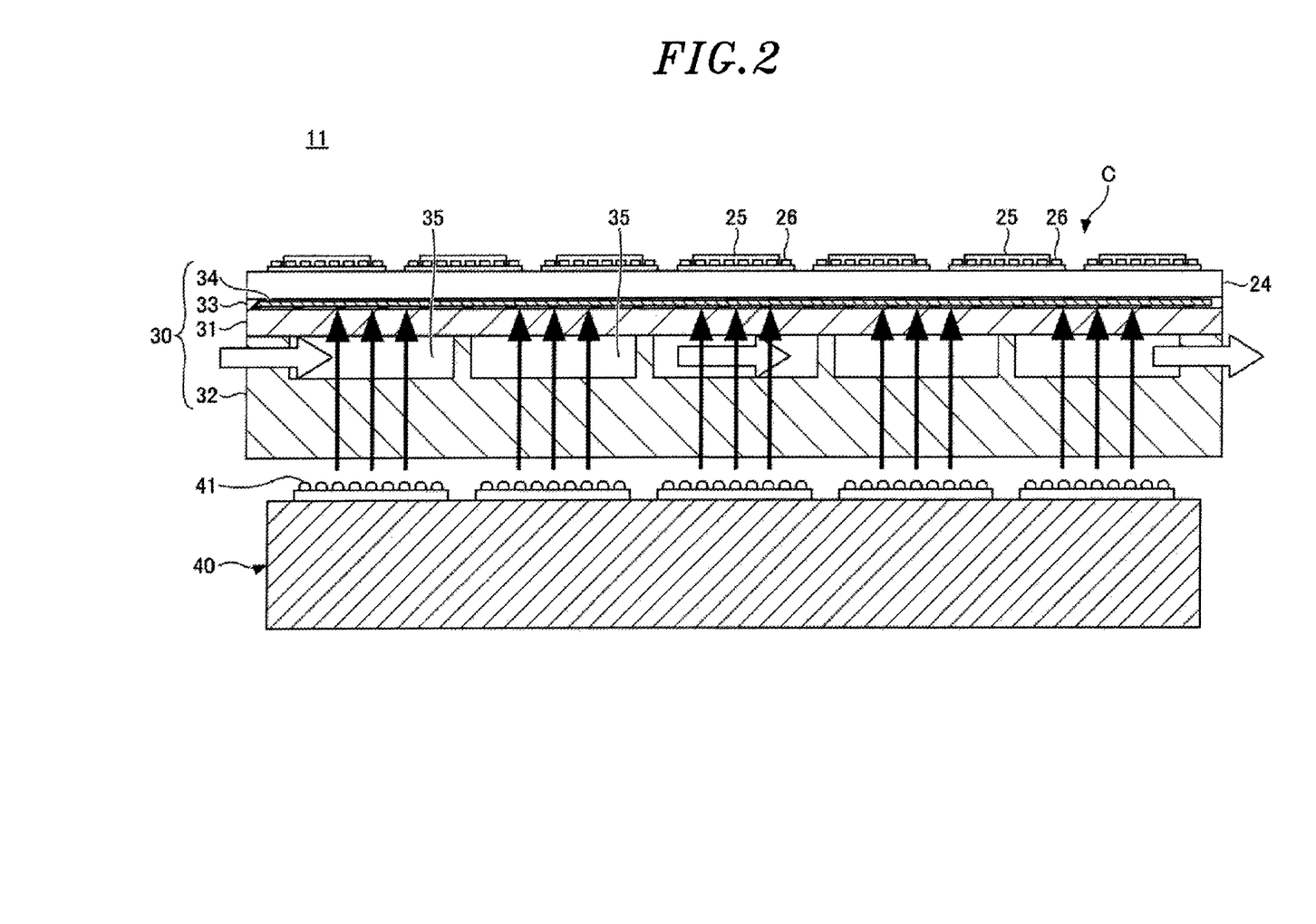
FIG. 2 is a cross-sectional view schematically showing an upper configuration of a stage according to a first embodiment.

Next, a substrate support according to a first embodiment will be described with reference to FIG. 2. FIG. 2 is a cross-sectional view schematically showing an upper configuration of the stage 11. In FIG. 2 (and FIGS. 4 and 5 to be described later), the flow of the coolant is indicated by white arrows. Further, in FIG. 2 (and FIGS. 3 to 5 to be described later), the light irradiated from the light irradiation mechanism 40 is indicated by solid arrows.

The carrier C placed on the stage 11 is formed as a substantially disc-shaped substrate 24. The electronic devices 25 diced from a semiconductor device are installed on a surface of the carrier C at predetermined intervals. Further, the carrier C has the electrode pads 26 corresponding to the electrodes of each electronic device 25, and a current can flow through a circuit in each electronic device 25 by applying a voltage to each electrode pad 26. The shape of the substrate 24 of the carrier C is not limited to a substantially disc shape, and may be, for example, a substantially rectangular shape as long as it can be placed on the stage 11.

The stage 11 includes a supporting unit 30 and a light irradiation mechanism 40.

The supporting unit 30 includes a plate member 31, a transparent member 32, an insulating film 33, and the resistance temperature detector film 34.

The plate member 31 is a substantially disc-shaped member on which the carrier C is placed.

A thermally sprayed film is formed on an upper surface of the plate member 31 (the placement surface of the carrier C). The thermally sprayed film includes an insulating film 33, and the insulating film 33 is formed by thermally spraying ceramic, for example, $Al_2O_3$, $Cr_2O_3$, $TiO_2$, $Y_2O_3$, YSZ, ZnO, $ZrSiO_4$, $MgAl_2O_4$, $Y_2SiO_5$, $Al_6Si_{12}O_{13}$, $HfO_2$, $Al_2O_3$—$TiO_2$, $VF_3$, $B_4Cl$, AlN, or the like.

The resistance temperature detector film 34 is a film of a resistance temperature detector formed in the insulating film 33. The resistance temperature detector film 34 is divided into predetermined regions to form a multi-channel sensor. The resistance temperature detector is formed as, for example, a thermally sprayed film of tungsten. The controller 19 (see FIG. 1) is connected to the resistance temperature detector film 34 through the wiring 20 (see FIG. 1). The controller 19 is controlled to detect a resistance value of the resistance temperature detector film 34 and estimate a temperature based on the resistance value.

In other words, the thermally sprayed film formed on the upper surface of the plate member 31 includes a first insulating film 33 formed on the plate member 31 and the resistance temperature detector film 34 formed on the first insulating film 33, and a second insulating film 33 formed on the resistance temperature detector film 34.

Further, grooves are formed on an upper surface of the transparent member 32, and the coolant channel 35 is formed by adhering or coupling the plate member 31 and the transparent member 32. The coolant is supplied from the coolant supply device 21 (see FIG. 1) to the coolant channel 35 through the supply pipe 22 (see FIG. 1). The coolant flowing through the coolant channel 35 is returned to the coolant supply device 21 through the return pipe 23 (see FIG. 1). Alternatively, grooves may be formed on a bottom surface of the plate member 31, and the coolant channel 35 may be formed by adhering or coupling the plate member 31 and the transparent member 32. The coolant may be, for example, colorless liquid that allows light to pass therethrough such as Galden (Registered Trademark) or water.

The light irradiation mechanism 40 includes a plurality of LEDs 41 for irradiating light. The plurality of LEDs 41 is divided into predetermined regions (sections) in plan view. The controller 19 can control the ON/OFF of the LEDs 41 for each region. The controller 19 controls each region to be switched between a high-temperature region where the LEDs 41 therein are turned on to increase the temperatures of the electronic devices and a low-temperature region where the LEDs 41 therein are not turned on. Although the light irradiation mechanism 40 using the LEDs 41 as a light source will be described, the type of the light source is not limited thereto.

In the stage 11 of the first embodiment, each of the plate member 31 and the transparent member 32 is made of a low thermal expansion material having a linear expansion coefficient of $1.0 \times 10^{-6}$/K or less. Further, each of the plate member 31 and the transparent member 32 is made of a transparent material. For example, each of the plate member 31 and the transparent member 32 is made of a quartz glass having a linear expansion coefficient of $1.0 \times 10^{-6}$/K or less. Further, the thermally sprayed film (the insulating film 33 and the resistance temperature detector film 34) that absorb light is formed on the upper surface of the plate member 31.

The light emitted from the light irradiation mechanism 40 is irradiated to the thermally sprayed film (the insulating film 33) while passing through the transparent member 32, the coolant flowing through the coolant channel 35, and the plate member 31. Accordingly, the temperature of the thermally sprayed film (the insulating film 33) irradiated with light is increased, and the temperatures of the electronic devices 25 are increased.

Figure 3A:
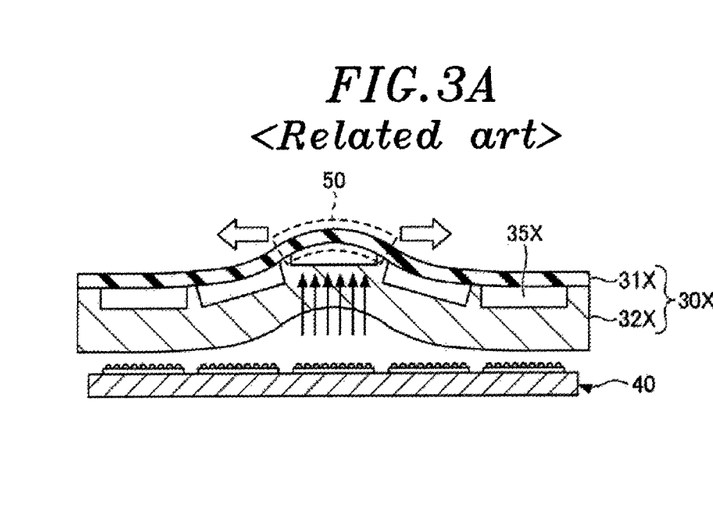
FIGS. 3A and 3B compare a stage of a reference example and a stage of the first embodiment at the time of light irradiation.
Figure 3B:
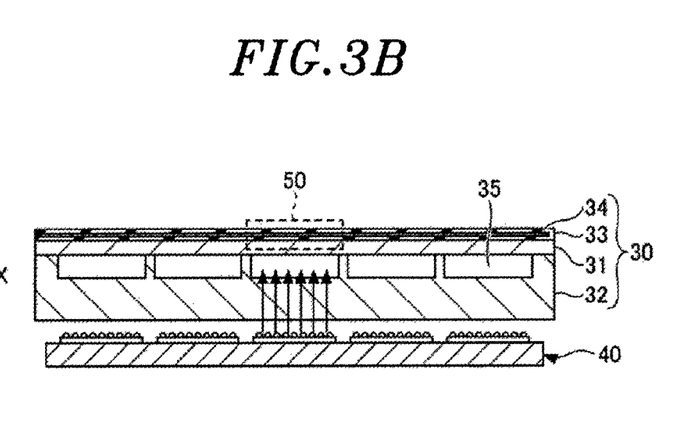

The effect of the stage 11 of the first embodiment will be described in comparison with a stage 11X of a reference example. FIGS. 3A and 3B compare the stage 11X of the reference example and the stage 11 of the first embodiment at the time of light irradiation. FIG. 3A shows an example of the stage 11X of the reference example, and FIG. 3B shows an example of the stage 11 of the first embodiment. The stage 11X of the reference example includes a supporting unit 30X and a light irradiation mechanism 40. The supporting unit 30X includes a plate member 31X and a transparent member 32X. A coolant channel 35X through which a coolant flows is formed in the supporting unit 30X. The plate member 31X is made of ceramic that absorbs light. The transparent member 32X transmits light. Further, the plate member 31X and the transparent member 32X are made of materials having substantially the same linear expansion coefficient. Further, the plate member 31X and the transparent member 32X of the reference example are made of a material having a linear expansion coefficient of $3.2 \times 10^{-6}$/K.

For example, the LEDs 41 in the region corresponding to the electronic devices 25 to be inspected are turned on. By irradiating light to the plate member 31X, a temperature increasing region 50 where a temperature is increased is formed at a central portion of an upper surface of the supporting unit 30X. In the example of this specification, since the temperature increasing region 50 is formed on the upper surface side of the supporting unit 30X, a temperature difference occurs between the upper surface side of the supporting unit 30X and the bottom surface side of the supporting unit 30X. Further, a high-temperature region irradiated with light (the central portion in the example of FIG. 3A) and a low-temperature region irradiated with no light (the outer peripheral portion in the example of FIG. 3A) are formed when the supporting unit 30X is viewed from the top. Therefore, a temperature difference also occurs in a plane direction. Accordingly, in the example shown in FIG. 3A, as shown by white arrows, the thermal expansion is greater at the central portion of the upper surface of the supporting unit 30X than at the other portions, and the supporting unit 30X on which the carrier C is placed is warped, which results in the deterioration of the flatness of the placement surface of the carrier C.

On the other hand, as shown in FIG. 3B, in the stage 11 of the first embodiment, even if the temperature increasing region 50 is formed at a central portion of the upper surface of the supporting unit 30, and a temperature difference occurs between the upper surface side and the bottom surface side of the supporting unit 30 and a temperature difference occurs between the high-temperature region irradiated with light and the low-temperature region irradiated with no light when viewed from the top, it is possible to suppress the warpage of the supporting unit 30 on which the carrier C is placed by suppressing the deformation caused by thermal expansion. Accordingly, the flatness of the placement surface of the carrier C can be ensured. Further, since the thermally sprayed film (including the insulating film 33 and the resistance temperature detector film 34) is formed as a thin film by thermal spraying, the stress caused by the thermal expansion of the thermally sprayed film is sufficiently smaller than the rigidity of the plate member 31. Thus, it is possible to sufficiently suppress the influence on the warpage of the supporting unit 30.

Figure 4:
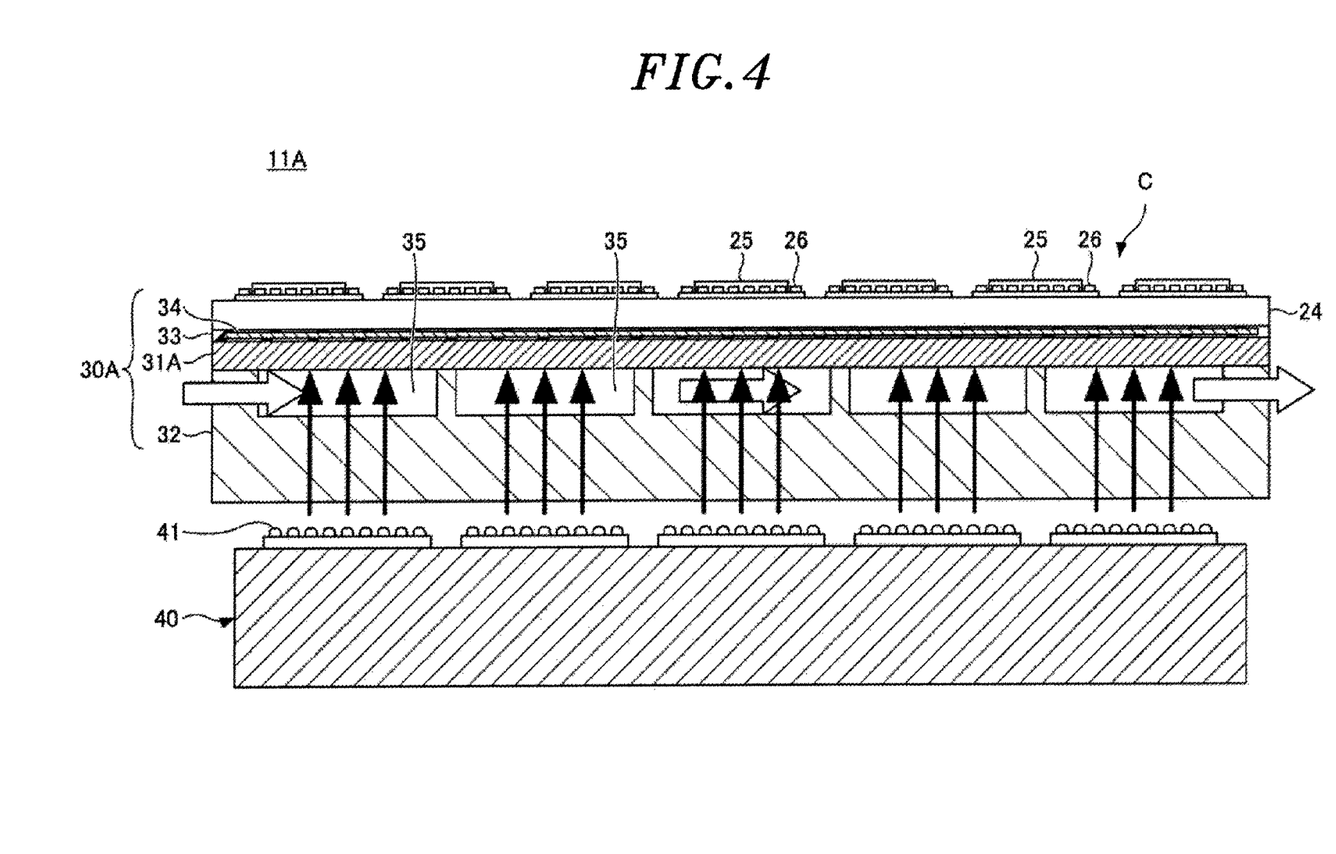
FIG. 4 is a cross-sectional view schematically showing an upper configuration of a stage according to a second embodiment.

Next, a stage 11A of a second embodiment will be described with reference to FIG. 4. FIG. 4 is a cross-sectional view schematically showing an upper configuration of the stage 11A. The stage 11A of the second embodiment includes a supporting unit 30A and a light irradiation mechanism 40. The supporting unit 30A includes a plate member 31A, a transparent member 32, an insulating film 33, and a resistance temperature detector film 34.

In the stage 11A of the second embodiment, each of the plate member 31A and the transparent member 32 is made of a low thermal expansion material having a linear expansion coefficient of $1.0 \times 10^{-6}$/K or less. Further, the plate member 31A is made of a non-transparent material (light impervious material). The transparent member 32 is made of a transparent material. For example, the plate member 31A is made of Invar (metal material) and the transparent member 32 is made of a quartz glass.

The light emitted from the light irradiation mechanism 40 is irradiated to a back surface of the plate member 31A while passing through the transparent member 32 and the coolant flowing through the coolant channel 35. Accordingly, the temperature of the plate member 31A irradiated with light is increased. The heat of the plate member 31A is transferred to the electronic devices 25 through the insulating film 33 and the resistance temperature detector film 34, so that the temperatures of the electronic devices 25 are increased.

With the configuration of the stage 11A of the second embodiment, even if a temperature difference occurs between the upper surface side and the bottom surface side of the supporting unit 30A and a temperature difference occurs between the high-temperature region irradiated with light and the low-temperature region irradiated with no light when viewed from the top, the warpage of the supporting unit 30 on which the carrier C is placed can be suppressed by suppressing the deformation caused by thermal expansion. Accordingly, the flatness of the placement surface of the carrier C can be ensured.

Figure 5:
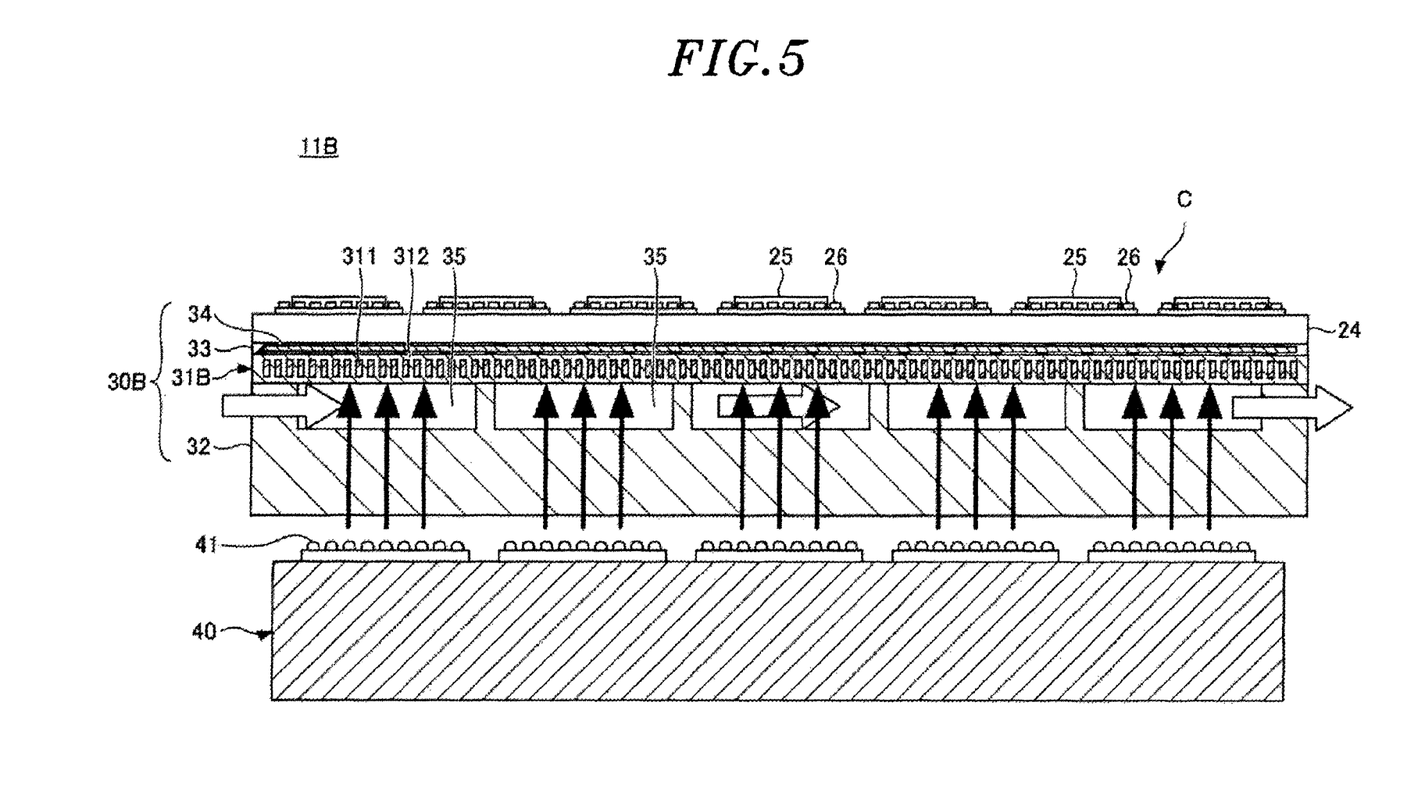
FIG. 5 is a cross-sectional view schematically showing an upper configuration of a stage according to a third embodiment.

Next, a stage 11B of the third embodiment will be described with reference to FIG. 5. FIG. 5 is a cross-sectional view schematically showing an upper configuration of the stage 11B. The stage 11B of the third embodiment includes a supporting unit 30B and a light irradiation mechanism 40. The supporting unit 30B includes a plate member 31B, a transparent member 32, an insulating film 33, and a resistance temperature detector film 34.

In the stage 11B of the third embodiment, the transparent member 32 is made of a low thermal expansion material having a linear expansion coefficient of $1.0 \times 10^{-6}$/K or less. The transparent member 32 is made of a transparent material. For example, the transparent member 32 is made of a quartz glass.

Further, the plate member 31B includes a plate-shaped member 311 having through-holes formed therethrough in a plate thickness direction, and a thermally conductive film 312 that covers the surface of the plate-shaped member 311 and fills the through-holes. The plate member 31 is made of a low thermal expansion material having a linear expansion coefficient of $1.0 \times 10^{-6}$/K or less. Further, the plate-shaped member 311 is made of a non-transparent material (light impervious material). For example, the plate-shaped member 311 is made of Invar (metal material). The thermally conductive film 312 is made of a material having high thermal conductivity, for example, an Au-plated film or a Cu-plated film.

The light emitted from the light irradiation mechanism 40 is irradiated to a back surface of the plate member 31B while passing through the coolant flowing through the transparent member 32 and the coolant channel 35. Accordingly, the temperature of the back surface side of the plate member 31B irradiated with light is increased. Further, the heat transfer from the back surface side of the plate member 31B to the front surface side of the plate member 31B is performed by the thermally conductive film 312. The heat of the plate member 31B is transferred to the electronic devices 25 through the insulating film 33 and the resistance temperature detector film 34, so that the temperatures of the electronic devices 25 are increased.

With the configuration of the stage 11B of the third embodiment, even if a temperature difference occurs between the upper surface side and the bottom surface side of the supporting unit 30B and a temperature difference occurs between the high-temperature region irradiated with light and the low-temperature region irradiated with no light when viewed from the top, the warpage of the supporting unit 30 on which the carrier C is placed can be suppressed by suppressing the deformation caused by thermal expansion. Accordingly, the flatness of the placement surface of the carrier C can be ensured. Further, the responsiveness of the temperature control of the electronic devices 25 can be improved by improving the thermal conductivity of the plate member 31B.

While the inspection apparatus 10 has been described above, the present disclosure is not limited to the above-described embodiments, and various changes and modifications can be made without departing from the scope of the appended claims and the gist thereof.

Although the carrier C on which the plurality of electronic devices 25 is installed has been described as an example of the inspection target of the inspection apparatus 10, the present disclosure is not limited thereto. For example, the inspection target of the inspection apparatus 10 may be a wafer on which a plurality of electronic devices is installed.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

What is claimed is:

1. A substrate support comprising:
   a supporting unit including a plate member on which an inspection target is placed and a transparent member; and
   a light irradiation mechanism configured to irradiate light to increase a temperature of the inspection target,
   wherein each of the plate member and the transparent member is made of a material having a linear thermal expansion coefficient of $1.0 \times 10^{-6}$/K or less,
   the plate member has a thermally sprayed film on a surface thereof, and
   the thermally sprayed film includes at least one insulating film and a resistance temperature detector film formed on the insulating film.

2. The substrate support of claim 1, wherein the plate member is made of a transparent member, and
   the thermally sprayed film is heated by the light irradiated from the light irradiation mechanism.

3. The substrate support of claim 1, wherein the plate member is made of a metal material, and
   the metal material is heated by the light irradiated from the light irradiation mechanism.

4. The substrate support of claim 1, wherein the plate member includes a metal member having holes formed therethrough in a thickness direction and a thermally conductive film formed on a surface of the metal member, and
   the plate member is heated by the light irradiated from the light irradiation mechanism.

5. The substrate support of claim 2, wherein the thermally sprayed film includes:
   a first insulating film formed on the plate member;
   the resistance temperature detector film formed on the first insulating film; and
   a second insulating film formed on the resistance temperature detector film.

6. The substrate support of claim 3, wherein the thermally sprayed film includes:
   a first insulating film formed on the plate member;
   the resistance temperature detector film formed on the first insulating film; and
   a second insulating film formed on the resistance temperature detector film.

7. The substrate support of claim 1, wherein the thermally sprayed film includes:
   a first insulating film formed on the plate member;
   the resistance temperature detector film formed on the first insulating film; and
   a second insulating film formed on the resistance temperature detector film.

8. The substrate support of claim 1, wherein the supporting unit further includes:
   a channel through which a coolant flows.

9. The substrate support of claim 2, wherein the supporting unit further includes:
   a channel through which a coolant flows.

10. The substrate support of claim 3, wherein the supporting unit further includes:
    a channel through which a coolant flows.

11. The substrate support of claim 4, wherein the supporting unit further includes:
    a channel through which a coolant flows.

12. The substrate support of claim 7, wherein the supporting unit further includes:
    a channel through which a coolant flows.

13. An inspection apparatus comprising:
    a substrate support on which an inspection target is placed;
    a probe card disposed to face the substrate support; and
    a tester connected to the probe card,
    wherein the substrate support includes:
    a supporting unit including a plate member on which the inspection target is placed and a transparent member; and
    a light irradiation mechanism configured to irradiate light to the inspection target to increase a temperature of the inspection target, wherein each of the plate member and the transparent member is made of a material having a linear thermal expansion coefficient of $1.0 \times 10^{-6}$/K or less, the plate member has a thermally sprayed film on a surface thereof, and the thermally sprayed film includes at least one insulating film and a resistance temperature detector film formed on the insulating film.

14. The inspection apparatus of claim 13, wherein the thermally sprayed film includes:

a first insulating film formed on the plate member;

the resistance temperature detector film formed on the first insulating film; and a second insulating film formed on the resistance temperature detector film.

* * * * *